United States Patent
Liu et al.

(10) Patent No.: US 10,468,517 B2
(45) Date of Patent: Nov. 5, 2019

(54) TUNNELING FIELD EFFECT TRANSISTOR HAVING INTERFACIAL LAYER CONTAINING NITROGEN

(71) Applicant: UNITED MICROELECTRONICS CORP., Hsin-Chu (TW)

(72) Inventors: An-Chi Liu, Tainan (TW); Chun-Hsien Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/691,779

(22) Filed: Aug. 31, 2017

(65) Prior Publication Data

US 2019/0043979 A1 Feb. 7, 2019

(30) Foreign Application Priority Data

Aug. 3, 2017 (CN) .......................... 2017 1 0655620

(51) Int. Cl.

| | |
|---|---|
| *H01L 29/78* | (2006.01) |
| *H01L 29/49* | (2006.01) |
| *H01L 23/535* | (2006.01) |
| *H01L 21/768* | (2006.01) |
| *H01L 29/66* | (2006.01) |
| *H01L 29/20* | (2006.01) |
| *H01L 29/739* | (2006.01) |

(52) U.S. Cl.
CPC ........ *H01L 29/78* (2013.01); *H01L 21/76897* (2013.01); *H01L 23/535* (2013.01); *H01L 29/20* (2013.01); *H01L 29/49* (2013.01); *H01L 29/4966* (2013.01); *H01L 29/66477* (2013.01); *H01L 29/66545* (2013.01); *H01L 29/7391* (2013.01)

(58) Field of Classification Search
None
See application file for complete search history.

(56) References Cited

U.S. PATENT DOCUMENTS

| | | | |
|---|---|---|---|
| 9,385,195 B1 * | 7/2016 | Zhang | H01L 29/1033 |
| 9,627,266 B2 | 4/2017 | Lee et al. | |
| 9,633,920 B2 | 4/2017 | Chiu et al. | |
| 2010/0038713 A1 * | 2/2010 | Majhi | H01L 21/2652 |
| | | | 257/344 |
| 2011/0312179 A1 * | 12/2011 | Nakagawa | C23C 14/14 |
| | | | 438/660 |
| 2013/0119395 A1 * | 5/2013 | Bhuwalka | H01L 29/7391 |
| | | | 257/76 |

(Continued)

OTHER PUBLICATIONS

Lu, Improved Interfacial and Electrical Properties of GaAs MOS Capacitor With LaON/TiON Multilayer Composite Gate Dielectric and LaON as Interfacial Passivation Layer, IEEE Transactions on Electron Devices, vol. 64, No. 4, Apr. 2017.

*Primary Examiner* — Bilkis Jahan
(74) *Attorney, Agent, or Firm* — Winston Hsu

(57) ABSTRACT

A method for fabricating a tunnel field effect transistor (TFET) includes the steps of providing a substrate and then forming an interfacial layer on the substrate. Preferably, the step of forming the interfacial layer includes the steps of: performing a plasma treatment process to inject a first gas containing nitrogen; injecting a second gas containing oxygen; and injecting a precursor to react with the first gas and the second gas for forming the interfacial layer.

6 Claims, 6 Drawing Sheets

(56) References Cited

U.S. PATENT DOCUMENTS

| | | | |
|---|---|---|---|
| 2015/0129960 A1* | 5/2015 | Hokazono | H01L 27/092 |
| | | | 257/338 |
| 2016/0247917 A1* | 8/2016 | Kondo | H01L 29/42368 |
| 2017/0067849 A1* | 3/2017 | Cobianu | G01N 27/4141 |
| 2017/0179283 A1* | 6/2017 | Pourghaderi | H01L 29/512 |

* cited by examiner

US 10,468,517 B2

TUNNELING FIELD EFFECT TRANSISTOR HAVING INTERFACIAL LAYER CONTAINING NITROGEN

BACKGROUND OF THE INVENTION

1. Field of the Invention

The present invention relates to a tunneling field effect transistor (TFET) and fabrication method thereof, and more particularly to a TFET having interfacial layer containing nitrogen and fabrication method thereof.

2. Description of the Prior Art

In the past decades, semiconductor integrated circuit (IC) industry has developed rapidly. The advancement of semiconductor materials and manufacturing technology allows ICs to contentiously shrink with increased complexity and improved performance. More semiconductor devices having smaller feature sizes may be formed within a unit area of a semiconductor substrate to achieve a higher integrity. However, it adversely results in some technological problems. For example, closely arranged semiconductors devices may have larger leakage current and obvious signal interference. Furthermore, power consumption is also a primary concern in advanced technology.

Tunneling field effect transistors (TFETs) have been proposed to take the place of conventional metal-oxide semiconductor field effect transistors (MOSFETs) in some applications confronted with the aforesaid problems. TFETs are advantageous over conventional MOSFETs in the respects of smaller sub-threshold swing (for example, smaller than 60 mV/dec), larger on-off current ratio ($I_{on}/I_{off}$) and smaller off-state leakage current ($I_{off}$).

However, there are still some problems in existing TFETs. For example, the on-state current ($I_{on}$) of a TFET is too low for certain application and the sub-threshold swing of a TFET still need further improvement.

SUMMARY OF THE INVENTION

According to an embodiment of the present invention, a method for fabricating a tunnel field effect transistor (TFET) includes the steps of providing a substrate and then forming an interfacial layer on the substrate. Preferably, the step of forming the interfacial layer includes the steps of: performing a plasma treatment process to inject a first gas containing nitrogen; injecting a second gas containing oxygen; and injecting a precursor to react with the first gas and the second gas for forming the interfacial layer.

According to another aspect of the present invention, a tunnel field effect transistor (TFET) includes: an interfacial layer on a substrate, wherein the interfacial layer comprises nitrogen; a gate electrode on the interfacial layer; a source region on one side of the gate structure; and a drain region on another side of the gate structure.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present invention.

Figure 1:
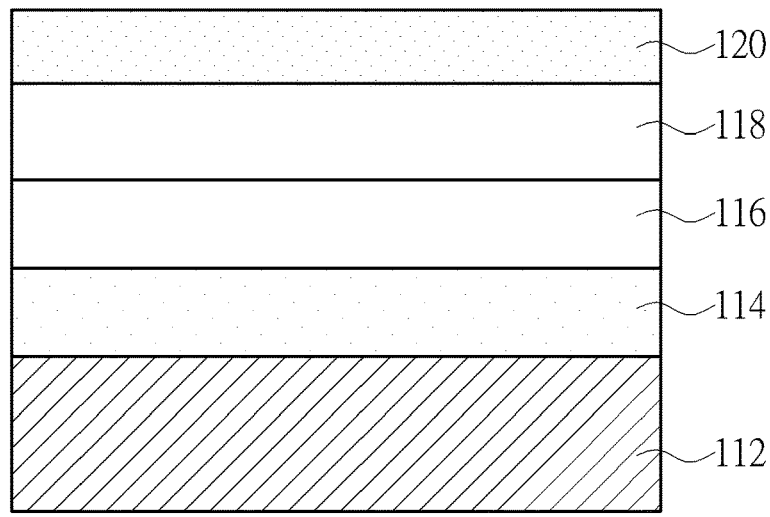
FIGS. 1-8 illustrate a method for fabricating a vertical TFET according to an embodiment of the present invention.

Please refer to FIG. 1, which is a cross-sectional diagram illustrating a TFET in the beginning of a series of successive fabricating steps according to one embodiment of the present invention. As shown in FIG. 1, a stacked structure comprising, from bottom to top, a semiconductor substrate 112, a source region 114, a tunneling region 116, a channel region 118 and a drain region 120 are provided.

The semiconductor substrate 112 may be a silicon substrate or a Group III-V semiconductor substrate. According to a preferred embodiment, the semiconductor substrate 112 is a substrate having a Group III-V epitaxial semiconductor compound or semiconductor alloy formed thereon. For example, the semiconductor substrate 112 may be, but is not limited to, a sapphire substrate on which a semiconductor compound such as SiGe, GaAsP, GaAs, AlGaAs, InGaAs, AlGaAsSb, InGaAsSb or a semiconductor alloy may be epitaxially grown thereon.

The source region 114, the tunneling region 116, the channel region 118 and the drain region 120 are preferably Group III-V semiconductor compounds. More preferably, the source region 114, the tunneling region 116, the channel region 118 and the drain region 120 are Group III-V semiconductor compounds particularly having small energy band gap, for example, smaller than 0.75 eV or 0.5 eV, but is not limited thereto. The source region 114 is a heavily doped region having a first conductivity type, having a dopant concentration larger than $1E10^{19}/cm^3$, but is not limited thereto. The tunneling region 116 is a heavily doped region or a doped region having a second conductivity type. The dopant concentration of the tunneling region 116 may be larger than $1E10^{19}/cm^3$, but is not limited thereto. The channel region 118 is a doped region having the second conductivity type. The dopant concentration of the channel region 118 may be smaller than $1E10^{13}/cm^3$, but is not limited thereto. The drain region 120 is a heavily doped region having the second conductivity type. The dopant concentration of the drain region 120 may be larger than $1E10^{19}/cm^3$, but is not limited thereto. The thickness of the tunneling region 116 is smaller than the thickness of the channel region 118. In a preferred embodiment, the thickness of the tunneling region 116 is less than the thicknesses of the source region 114, the channel region 118 and the drain region 120, respectively.

According to an embodiment, the first conductivity type is P type and the second conductivity type is N type. For example, the source region 114 may be a P$^+$ AlGaAs region, the tunneling region 116 may be an N$^+$ InGaAs region, the channel region 118 may be an N$^-$ AlGaAs region, and the drain region 120 may be an N$^+$ AlGaAs region, but is not limited thereto.

It should be noticed that the concentrations of dopants in the source region 114, the tunneling region 116, the channel region 118 and the drain region 120 may be individually controlled during their respective epitaxial growing processes. An additional implantation process may be performed after their respective epitaxial growing process to further adjust the dopant concentrations.

Figure 2:
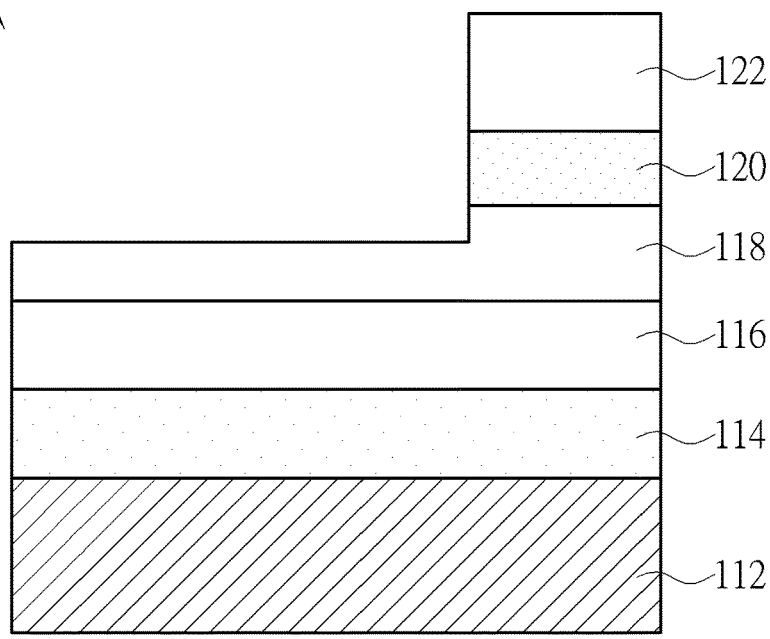

Please refer to FIG. 2, which is a cross-sectional diagram illustrating a TFET after the step of etching a channel layer of the TFET according to one embodiment of the present invention. As shown in FIG. 2, after forming a patterned mask 122 on the drain region 12, an etching process using the patterned mask 122 as an etching mask is performed to etch away a portion of the drain region 120 and the channel region 118, thereby transferring the pattern of the patterned mask 122 to the drain region 120 and the channel region 118 successively. The patterned mask 122 may be, for example, a patterned photoresist. According to the embodiment, the etching process may form a step-shaped structure having a step-height on the top surface of the channel region 118. According to various embodiments, the etching process may only remove the drain region 120 exposed from the patterned mask 122 without further removing any portion of the channel region 118 directly under the removed drain region 120, and consequently no step-height would be formed on the top surface of the channel region 118. Optionally, a doping process may be performed to further adjust the dopant concentration of the exposed channel region 118, and then the patterned mask 122 is removed.

Figure 3:
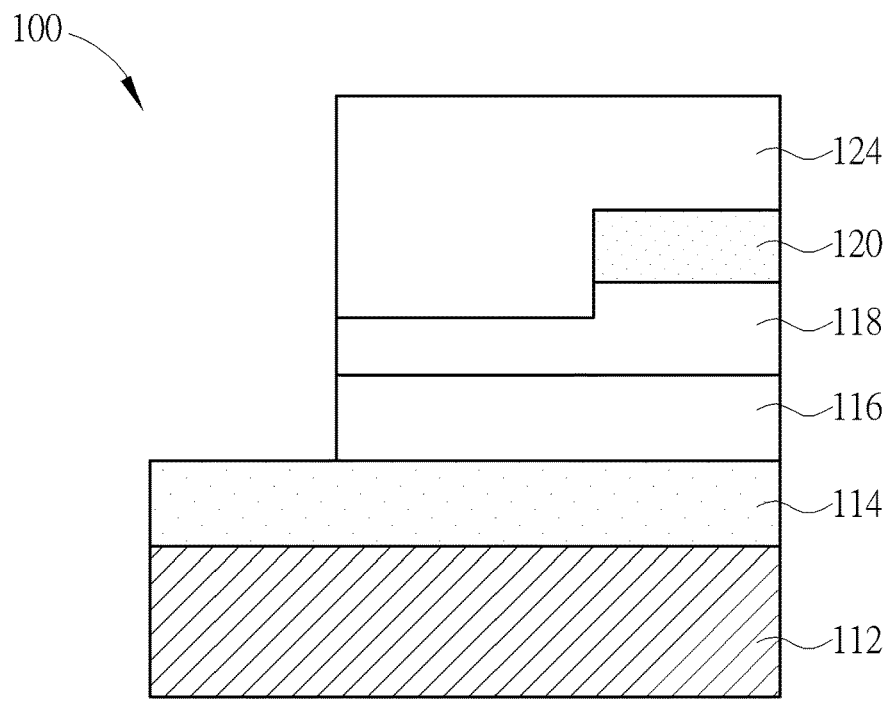

Please refer to FIG. 3, which is a cross-sectional diagram illustrating a TFET after the step of etching a tunneling layer of the TFET according to one embodiment of the present invention. After removing the pattern mask 122, another patterned mask 124, for example, a patterned photoresist, is formed on the channel region 118 and the drain region 120. Another etching process using the patterned mask 124 as an etching mask is then performed to etching away a portion of the channel region 118 and the tunneling region 115 exposed from the patterned mask 124 until a top surface of the source region 114 is exposed. Similarly, an optional doping process may be performed to further adjust the dopant concentration of the exposed source region 114, and then the patterned mask 124 is removed.

Figure 4:
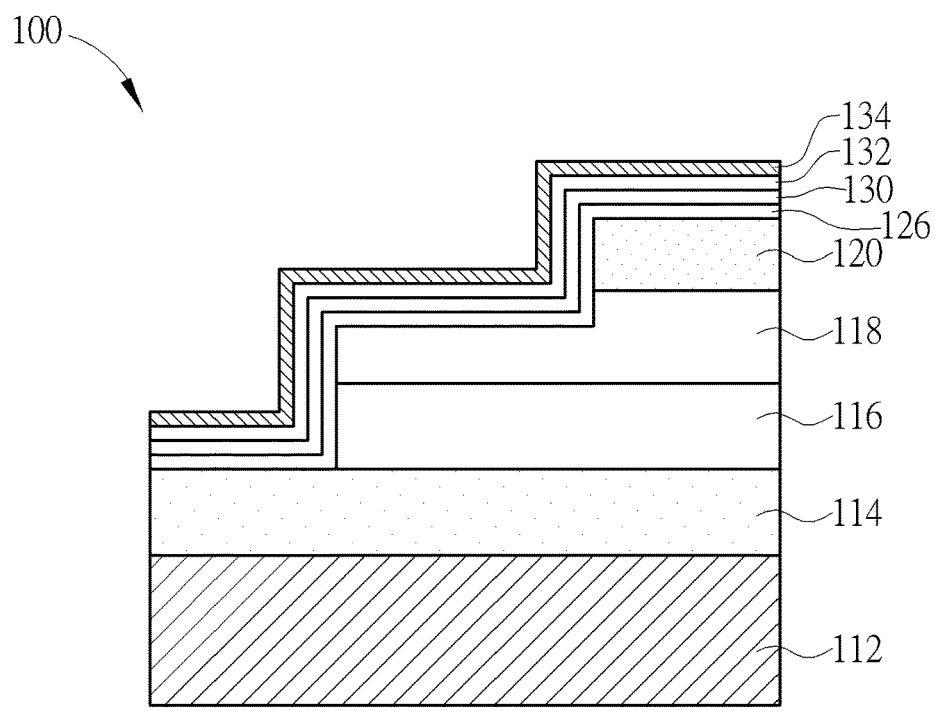

Please refer to FIG. 4, is a cross-sectional diagram illustrating a TFET after the step of depositing a first metal layer of the TFET according to one embodiment of the present invention. After patterning the drain region 120, the channel region 118 and the tunneling region 116 and exposing a portion of the source region 114, an interfacial layer 126, a gate dielectric layer 130, a bottom barrier layer 132 and a first metal layer 134 are successively formed conformally covering the top surface of the source region 114, the sidewall of the tunneling region 116, the sidewall and the top surface of the channel region 118, and the sidewall and the top surface of the drain region.

It should be noted that the formation of the interfacial layer 126 is accomplished by first performing a plasma treatment process to inject a first gas containing nitrogen, injecting a second gas containing oxygen, and then injecting a precursor to react with the first gas and the second gas for forming the interfacial layer 126.

Specifically, the first gas includes $NH_3$, $N_2$, or combination thereof, the second gas includes $N_2O$, $O_2$, or combination thereof, and the precursor preferably includes elements such as La or Hf and an example of the precursor could include $HfCl_4$. In this embodiment, an interfacial layer 126 containing nitrogen is formed after reacting the first gas, the second gas, and the precursor, in which the interfacial layer 126 could be a dielectric layer including but not limited to for example LaON or HfON.

Next, an atomic layer deposition (ALD) process is conducted to form a gate dielectric layer 130 on the surface of the interfacial layer 126. According to one embodiment, the gate dielectric layer 130 is a high-k dielectric layer. Preferably, the dielectric constant (k) of the gate dielectric layer 130 is larger than 4. The material of the gate dielectric layer 130 may be selected from a group comprising, but is not limited to, hafnium oxide ($HfO_2$), hafnium silicon oxide ($HfSiO_2$), hafnium silicon oxynitride (HfSiON), aluminum oxide ($Al_2O_3$), lanthanum oxide ($La_2O_3$), lanthanum aluminum oxide ($LaAlO_3$), tantalum oxide ($Ta_2O_3$), zirconium oxide ($ZrO_2$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), barium strontium titanate ($Ba_xSr_{1-x}TiO_3$, BST) and other suitable rare-earth metal oxides. The bottom barrier layer 132 preferable includes titanium nitride (TiN) and has a thickness, for example, larger than 20 angstroms. The first metal layer 134 preferably includes titanium or aluminum, but is not limited thereto.

Figure 5:
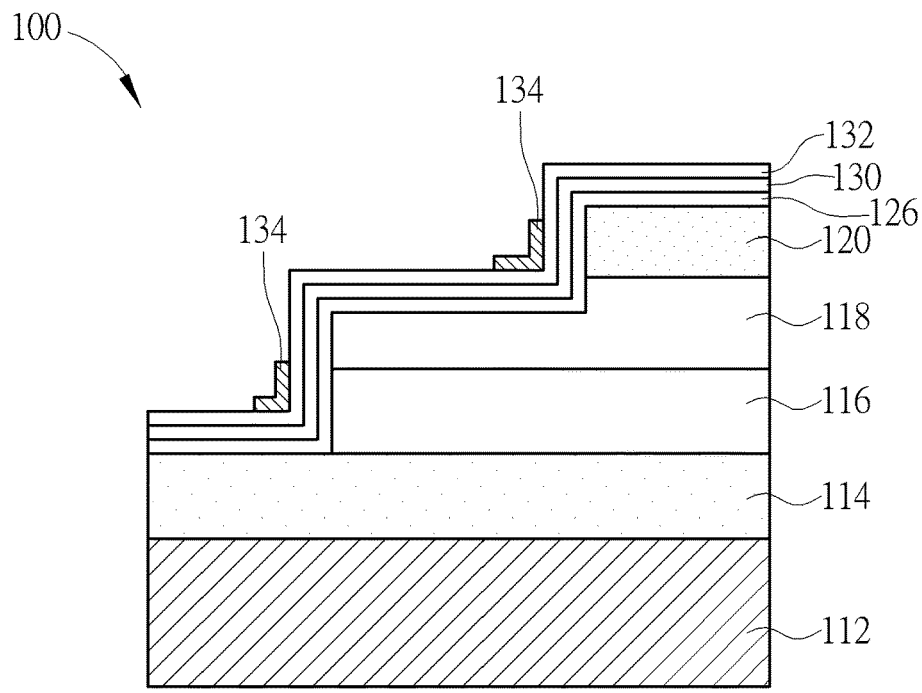

Please refer to FIG. 5, which is a cross-sectional diagram illustrating a TFET after the step of performing an anisotropic etching process to etch the first metal layer of the TFET according to one embodiment of the present invention. After forming the gate dielectric layer 130, the bottom barrier layer 132 and the first metal layer 134, an anisotropic etching process is performed to etch the first metal layer 134 until the first metal layer 134 becomes discrete portions and exposes most of the underlying bottom barrier layer 132. It is one feature of the present invention that the removal rate of the first metal layer 134 in the corner regions are slower than other regions because that the etchants used in the anisotropic etching process have less possibility to get into the corner regions. As a result, a portion of the first metal layer 134 at the corner defined by the top surface of the source region 114 and the sidewall of the tunneling region 116 and another portion of the first metal layer 134 at the corner defined by the top surface channel region 118 and the sidewall of the drain region would remain after the anisotropic etching process. In other words, the continuous first metal layer 134 is patterned into discrete portions at each corner respectively without performing a conventional photolithography process. The process of patterning the first metal layer 134 may be regarded as a self-aligned patterning process.

Figure 6:
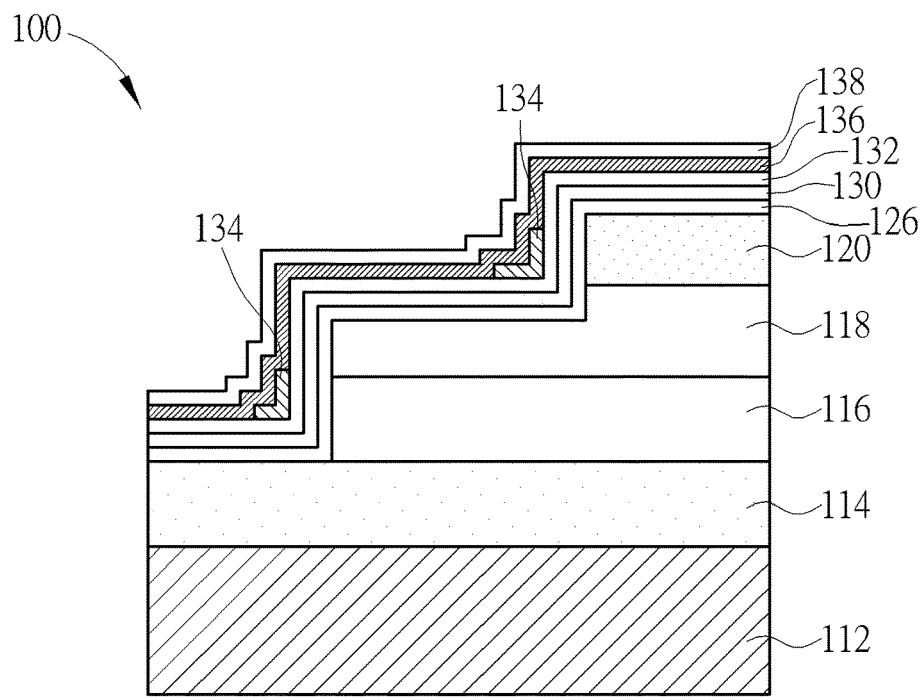

Please refer to FIG. 6, which is a cross-sectional diagram illustrating a TFET after the step of depositing a second metal layer of the TFET according to one embodiment of the present invention. After patterning the first metal layer 134, a second metal layer 136 and a top barrier layer 138 are successively and conformally formed on the bottom barrier layer 132 and the first metal layer 134. Preferably, the second metal layer 136 is in direct contact with the first metal layer 134. According to one embodiment, the composition of the second metal layer 136 is different from the composition of the first metal layer 134. For example, the first metal layer 134 may comprise aluminum (Al), and the second metal layer 136 may comprise titanium nitride (TiN). According to one embodiment, the top barrier layer 138 may include titanium nitride (TiN) having a thickness larger than 20 angstroms.

Figure 7:
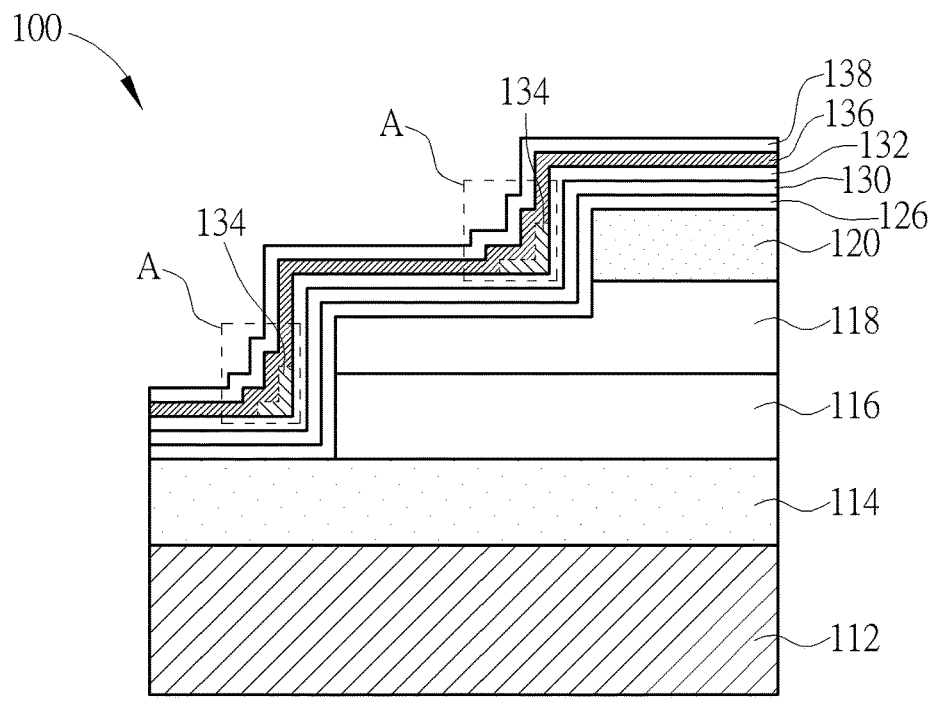

Please refer to FIG. 7, which is a cross-sectional diagram illustrating a TFET after the step of performing a thermal process according to one embodiment of the present invention. After forming the second metal layer 136 and the top barrier layer 138, a thermal process is performed to diffuse the metal atoms of the first metal layer 134 into nearby second metal layer 136, or reversely diffuse the metal atoms of the second metal layer 136 into nearby first metal layer 134. The thermal process may be a thermal anneal process. According to one embodiment wherein the first metal layer 134 is made of aluminum and the second metal layer 136 is made of titanium nitride, the aluminum atoms of the first metal layer 134 in region A of the TFET are diffused into nearby second metal layer 136, and the titanium atoms of the second metal layer 136 are diffused into the underlying first metal layer 134 concurrently during the thermal process. After the thermal process, a TiAlN alloy made from the first metal layer 134 and the second metal layer 136 would be formed in region A of the TFET, as shown in FIG. 7.

Figure 8:
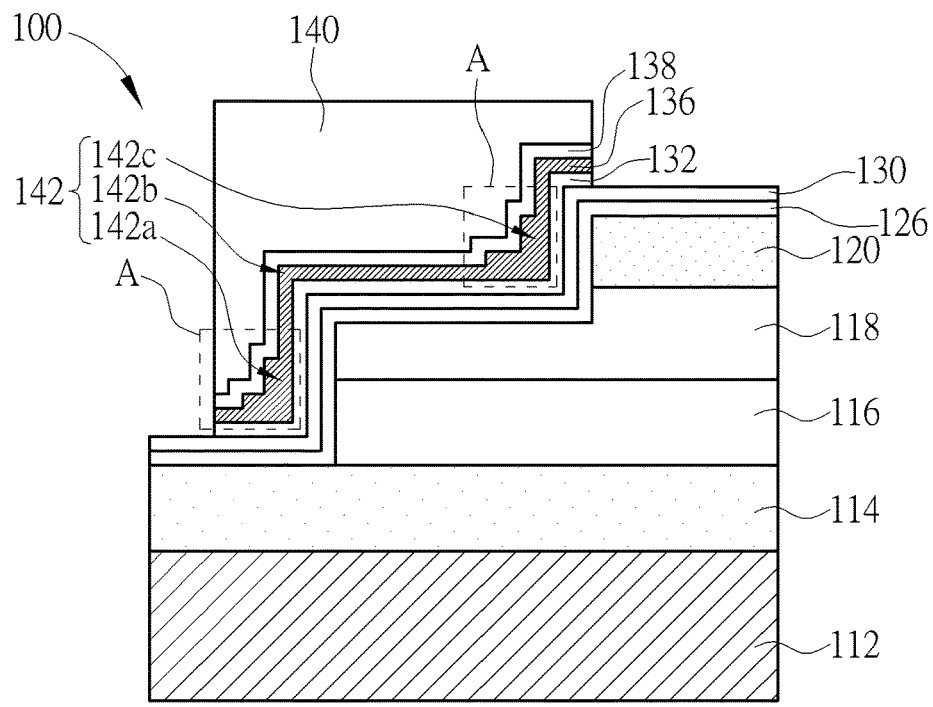

Please refer to FIG. 8, which is a cross-sectional diagram illustrating a TFET after the step of performing a patterning process according to one embodiment of the present invention. After the thermal process shown in FIG. 7, a patterned mask 140, for example, a patterned photoresist is formed on the top barrier layer 138. An etching process using the patterned mask 140 as an etching mask is then performed to transfer the pattern of the patterned mask 140 to the top barrier layer 138 and the second metal layer 136. According to one embodiment, the etching process may also transfer the pattern of the patterned mask 140 to the bottom barrier layer 132 and the gate dielectric layer 130. The patterned mask 140 is removed after the etching process, and a vertical-type TFET 100 according to the embodiment of the present invention is obtained.

Please still refer to FIG. 8. The TFET 100 has a gate electrode 142 including at least a first gate electrode 142a, a second gate electrode 142b and a third gate electrode 142c. The first gate electrode 142a and the third gate electrode 142c in the two regions A of the TFET have the same composition because they are formed by thermal diffusion of the metal atoms of the first metal layer 134 and the second metal layer 136. On the other hand, the second gate electrode 142b would have a composition different from the compositions of the first gate electrode 142a and the third gate electrode 142c. According to one embodiment of the present invention, the first gate electrode 142a and the third gate electrode 142c have the same work function which is smaller than the work function of the second gate electrode 142b. For example, the first gate electrode 142a and the third gate electrode 142c have the same work function of 4.1 eV, and the second gate electrode 142b has a work function of 4.5 eV.

According to one embodiment of the present invention, the first gate electrode 142a and the third gate electrode 142c have gradient metal concentrations. More specifically, the first gate electrode 142a and the third gate electrode 142c comprise a particular kind of metal atoms in a concentration reducing gradually from their bottoms to their tops, and comprise another particular kind of metal atoms in a concentration increasing gradually from their bottoms to their tops. For example, according to one embodiment wherein the first metal layer 134 is made of aluminum and the second metal layer 136 is made of titanium nitride, the concentration of aluminum atoms reduces from the bottom to the top of the first gate electrode 142a and the third gate electrode 142c, and the concentration of titanium atoms increases from the bottom to the top of the first gate electrode 142a and the third gate electrode 142c.

Figure 9:
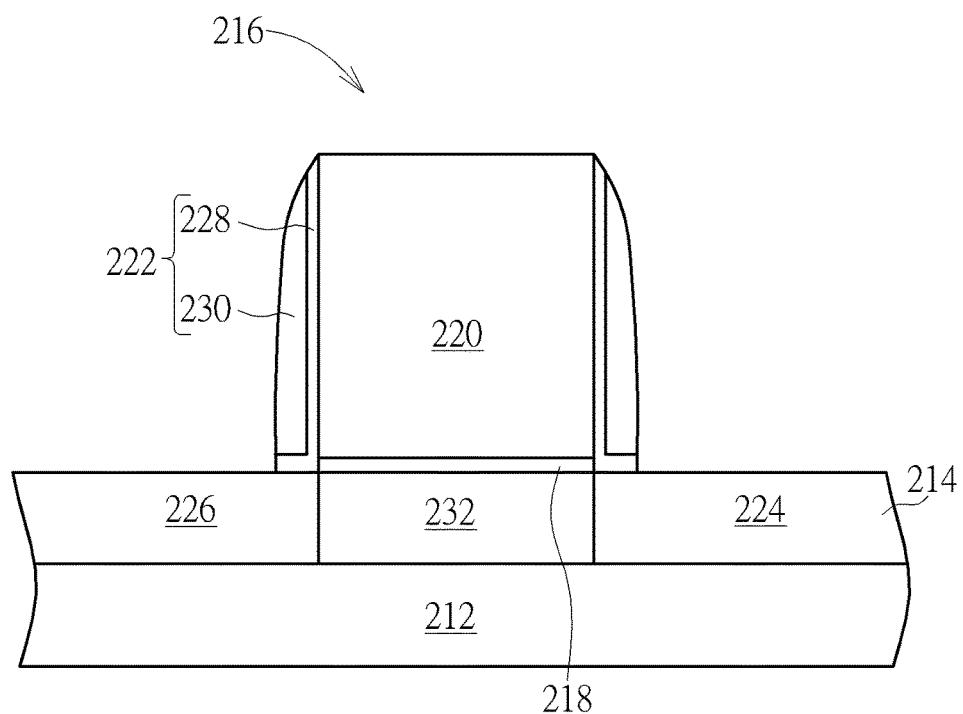
FIGS. 9-11 illustrate a method for fabricating a planar TFET according to an embodiment of the present invention.
Figure 10:
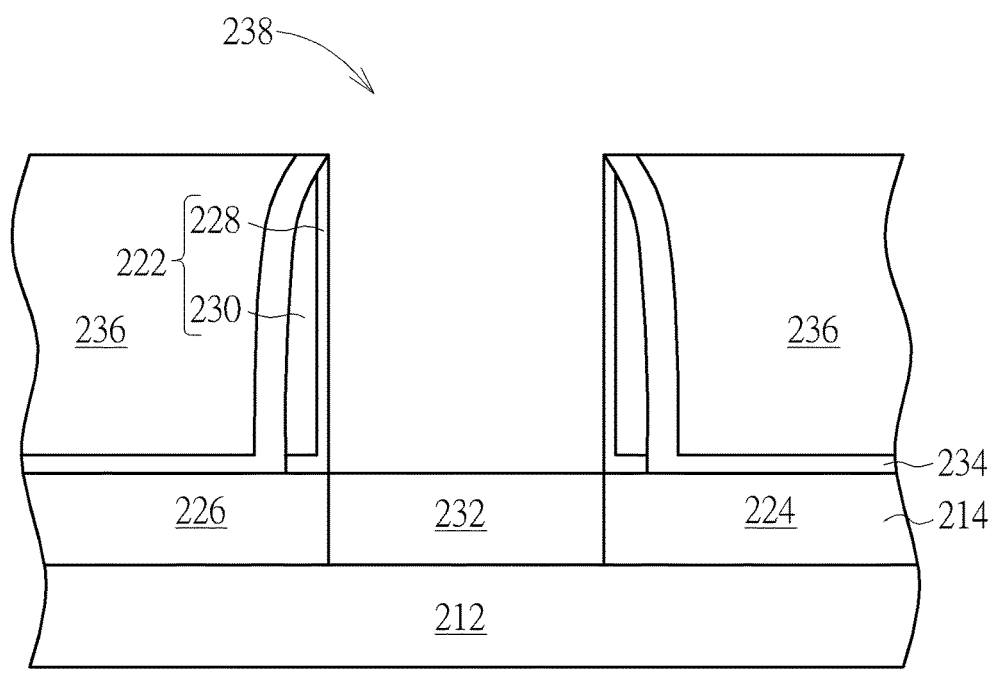
Figure 11:
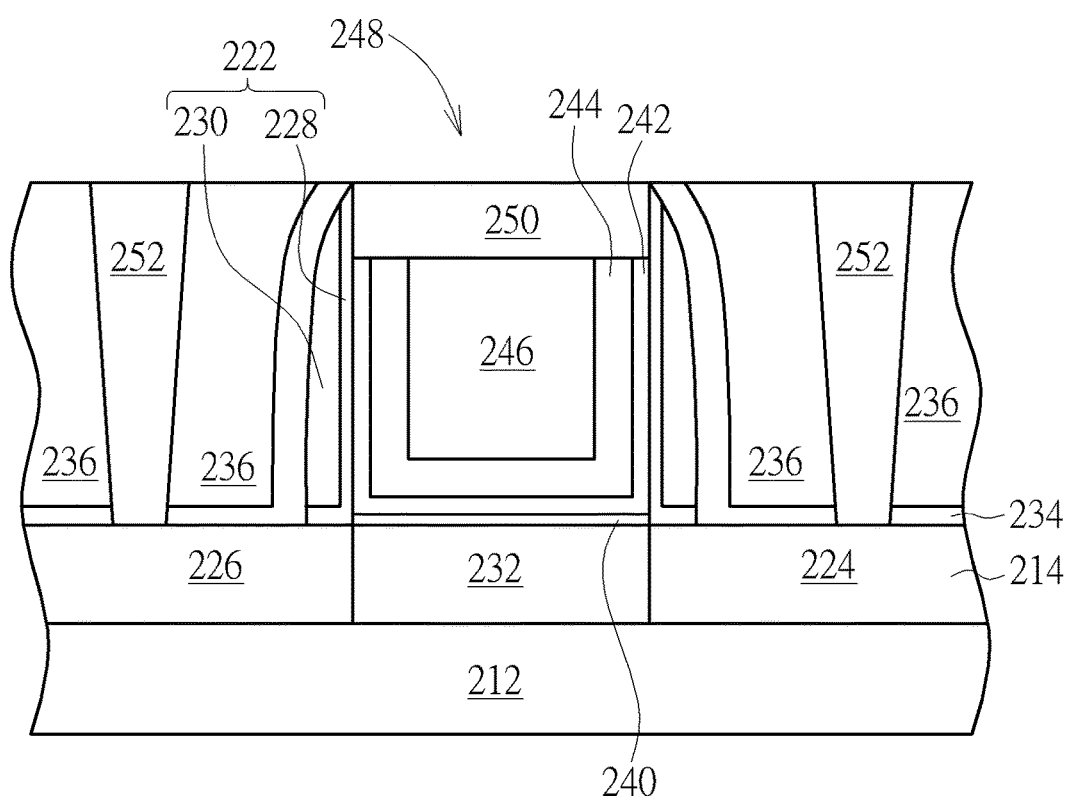

Referring to FIGS. 9-11, FIGS. 9-11 illustrate a method for fabricating a planar TFET according to an embodiment of the present invention. As shown in FIG. 9, a substrate 212 such as a silicon substrate or silicon-on-insulator (SOI) substrate is provided, and a fin-shaped structure 214 is formed on the substrate 212, in which the bottom of the fin-shaped structure 214 is surrounded by an insulating layer made of material such as silicon oxide to form a shallow trench isolation (STI).

Similar to the aforementioned embodiment, it would be desirable to implant dopants of particular conductive type into the fin-shaped structure 214 depending on the type of TFET device being fabricated. For instance, if a n-type TFET were to be fabricated, it would be desirable to implant phosphorus or arsenic ions into the fin-shaped structure 214, in which the concentration of the implanted dopants could be approximately $10^{13}$-$10^{18}$ cm$^{-3}$. If a p-type TFET were to be fabricated, it would be desirable to implant boron ions into the fin-shaped structure 214, in which the concentration of the implanted dopants could be approximately $10^{13}$-$10^{18}$ cm$^{-3}$.

According to an embodiment of the present invention, the fin-shaped structure 214 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structure 214 could also be obtained by first forming a patterned mask (not shown) on the substrate, 212, and through an etching process, the pattern of the patterned mask is transferred to the substrate 212 to form the fin-shaped structure. Moreover, the formation of the fin-shaped structure could also be accomplished by first forming a patterned hard mask (not shown) on the substrate 212, and a semiconductor layer composed of silicon germanium is grown from the substrate 212 through exposed patterned hard mask via selective epitaxial growth process to form the corresponding fin-shaped structure. These approaches for forming fin-shaped structure are all within the scope of the present invention.

Next, at least a gate structure 216 or dummy gate is formed on the substrate 212. In this embodiment, the formation of the gate structure 216 could be accomplished by a gate first process, a high-k first approach from gate last process, or a high-k last approach from gate last process. Since this embodiment pertains to a high-k last approach, a gate dielectric layer 16 or interfacial layer, a gate material layer made of polysilicon, and a selective hard mask could be formed sequentially on the substrate 212, and a photo-etching process is then conducted by using a patterned resist (not shown) as mask to remove part of the gate material layer and part of the gate dielectric layer through single or multiple etching processes. After stripping the patterned resist, a gate electrode or gate structure 216 composed of patterned gate dielectric layer 218 and patterned gate material layer 220 is formed on the substrate 212.

Next, at least a spacer 222 is formed on the sidewalls of the gate structure 216, a source region 224 is formed in the fin-shaped structure 214 on one side of the spacer 222, and a drain region 226 is formed in the fin-shaped structure 214 on another side of the spacer 222, and a silicide layer (not shown) could be selectively formed on the surface of the source region 224 and drain region 226. In this embodiment, the spacer 222 could be a single spacer or a composite spacer, such as a spacer including but not limited to for example an offset spacer 228 and a main spacer 230. Preferably, the offset spacer 228 and the main spacer 230 could include same material or different material while both the offset spacer 228 and the main spacer 230 could be made of material including but not limited to for example $SiO_2$, SiN, SiON, SiCN, or combination thereof.

It should be noted that the formation of the source region 224 and the drain region 226 could be accomplished by first forming a patterned mask (not shown) to cover the gate structure 216 and the fin-shaped structure 214 on one side (such as left side) of the gate structure 216, and then conducting an ion implantation process to implant dopants into the fin-shaped structure 214 on another side (such as right side) of the gate structure 216 to form the source region 224. After removing the patterned mask, another patterned mask could be formed to cover the gate structure 216 and the source region 224, and another ion implantation process is conducted to implant dopants into fin-shaped structure 214 on another side or the opposite side of the source region 224 to form the drain region 226 and at the same time define a channel region 232 in the fin-shaped structure 214 directly under the gate structure 216.

Since the present embodiment pertains to the fabrication of a n-type TFET device, the source region 224 preferably includes p-type dopants such as boron while the channel region 232 and the drain region 226 include n-type dopants such as phosphorus or arsenic. During operation, the source region 224 is preferably connected to ground and a positive voltage is applied to the gate structure 216. In another embodiment such as if a p-type TFET were to be fabricated, the source region 224 of the device would include n-type dopants while the channel region 232 and the drain region 226 would include p-type dopants. During operation of a p-type TFET, the source region 224 is connected to ground and negative voltage is applied to the gate structure 216.

After the aforementioned ion implantations are completed and after the patterned mask is removed, a thermal treatment process such as a rapid thermal treatment, a spike anneal process, or a laser anneal process could be conducted to activate the implanted dopants to form heavily doped regions in the source region 224 and drain region 226 respectively. It should be noted that each of the source region 224 and the drain region 226 would slightly expand during the thermal treatment process. Specifically, the area of the source region 224 and the drain region 226 would extend toward the channel region 232 directly under the gate structure 216 so that the resulting gate structure would be more close to the source region 224 and the drain region 226 thereby improving the performance of the device.

Next, as shown in FIG. 10, a contact etch stop layer (CESL) 234 is formed on the substrate 212 surface and the gate structure 216, and an interlayer dielectric (ILD) layer 236 is formed on the CESL 234 afterwards. Next, a planarizing process such as a chemical mechanical polishing (CMP) process is conducted to remove part of the ILD layer 236 and part of the CESL 234 to expose the gate material layer 220 composed of polysilicon so that the top surfaces of the gate material layer 220 and ILD layer 236 are coplanar.

Next, a replacement metal gate (RMG) process is conducted to transform the gate structure 216 into a metal gate. For instance, the RMG process could be accomplished by first performing a selective dry etching or wet etching process using etchants including but not limited to for example ammonium hydroxide ($NH_4OH$) or tetramethylammonium hydroxide (TMAH) to remove the gate material layer 220 or even gate dielectric layer 218 from gate structure 216 for forming a recess 238 in the ILD layer 236.

Next, as shown in FIG. 11, an interfacial layer 240 is formed on the surface of the fin-shaped structure 214 in the recess 238. Similar to the aforementioned embodiment, the formation of the interfacial layer 240 is accomplished by first performing a plasma treatment process to inject a first gas containing nitrogen, injecting a second gas containing oxygen, and then injecting a precursor to react with the first gas and the second gas for forming the interfacial layer 240.

Specifically, the first gas includes $NH_3$, $N_2$, or combination thereof, the second gas includes $N_2O$, $O_2$, or combination thereof, and the precursor preferably includes elements such as La or Hf and an example of the precursor could include $HfCl_4$. In this embodiment, an interfacial layer 240 containing nitrogen is formed after reacting the first gas, the second gas, and the precursor, in which the interfacial layer 240 could be a dielectric layer including but not limited to for example LaON or HfON.

Next, an atomic layer deposition (ALD) process is conducted to form a gate dielectric layer 242 on the surface of the interfacial layer 240. According to one embodiment, the gate dielectric layer 242 is a high-k dielectric layer. Preferably, the dielectric constant (k) of the gate dielectric layer 242 is larger than 4. The material of the gate dielectric layer 242 may be selected from a group comprising, but is not limited to, hafnium oxide ($HfO_2$), hafnium silicon oxide ($HfSiO_2$), hafnium silicon oxynitride (HfSiON), aluminum oxide ($Al_2O_3$), lanthanum oxide ($La_2O_3$), lanthanum aluminum oxide ($LaAlO_3$), tantalum oxide ($Ta_2O_3$), zirconium oxide ($ZrO_2$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), barium strontium titanate ($Ba_xSr_{1-x}TiO_3$, BST) and other suitable rare-earth metal oxides. The bottom barrier layer 132 preferable comprises titanium nitride (TiN) and has a thickness, for example, larger than 20 angstroms. The first metal layer 134 preferably comprises titanium or aluminum, but is not limited thereto.

Next, a work function metal layer 244 and a low resistance metal layer 246 are formed in the recess 238, and a planarizing process such as CMP is conducted to remove part of the low resistance metal layer 246, part of the work function metal layer 244, and part of the high-k dielectric layer 242 to form metal gate 248. Next, part of the low resistance metal layer 246, part of the work function metal layer 244, and part of the high-k dielectric layer 242 are removed to form a recess (not shown), and a hard mask 250 made of dielectric material such as silicon nitride is formed into the recess, in which the top surfaces of the hard mask 250 and the ILD layer 236 are coplanar. In this embodiment, the gate structure or metal gate 248 fabricated through high-k last process of a gate last process preferably includes an interfacial layer 240 containing nitrogen, a U-shaped high-k dielectric layer 242, a U-shaped work function metal layer 244, and a low resistance metal layer 246.

In this embodiment, the work function metal layer 244 is formed for tuning the work function of the metal gate in accordance with the conductivity of the device. For an NMOS transistor, the work function metal layer 244 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 244 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 244 and the low resistance metal layer 246, in which the material of the barrier layer may include titanium (Ti), titanium nitride (TiN), tantalum (Ta) or tantalum nitride (TaN). Furthermore, the material of the low-resistance metal layer 246 may include copper (Cu), aluminum (Al), titanium aluminum (TiAl), cobalt tungsten phosphide (CoWP) or any combination thereof.

Next, a photo-etching process is conducted by using a patterned mask (not shown) as mask to remove part of the ILD layer 236 adjacent to the metal gate 248 for forming contact holes (not shown) exposing the source region 224 and drain region 226. Next, metals including a barrier layer selected from the group consisting of Ti, TiN, Ta, and TaN and a low resistance metal layer selected from the group consisting of W, Cu, Al, TiAl, and CoWP are deposited into the contact holes, and a planarizing process such as CMP is conducted to remove part of aforementioned barrier layer and low resistance metal layer for forming contact plugs 252 electrically connecting the source region 224 and drain region 226. This completes the fabrication of a semiconductor device according to a preferred embodiment of the present invention.

Overall, the present invention discloses an approach to form interfacial layer on the substrate for improving leakage of a TFET, in which the interfacial layer formed could be applied to a vertical TFET or a planar TFET depending on the demand of the product. According to a preferred embodiment of the present invention, the formation of the interfacial layer is accomplished by first performing a plasma treatment process to inject a first gas containing nitrogen, injecting a second gas containing oxygen, and then injecting a precursor to react with the first gas and the second gas for forming the interfacial layer.

Preferably, the first gas includes $NH_3$, $N_2$, or combination thereof, the second gas includes $N_2O$, $O_2$, or combination thereof, and the precursor preferably includes elements such as La or Hf and an example of the precursor could include $HfCl_4$. In this embodiment, an interfacial layer containing nitrogen is formed after reacting the first gas, the second gas, and the precursor, in which the interfacial layer preferably be a dielectric layer including but not limited to for example LaON or HfON.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A tunnel field effect transistor (TFET), comprising:
an interfacial layer on a substrate, wherein the interfacial layer comprises LaON;
a high-k dielectric layer on the interfacial layer;
a gate electrode on the high-k dielectric layer, wherein the gate electrode includes a first gate electrode, a second gate electrode and a third gate electrode, the second gate electrode is disposed between the first gate electrode and the third gate electrode, wherein the second gate electrode comprises a composition different from the compositions of the first gate electrode and the third gate electrode, respectively, and the first gate electrode and the third gate electrode have the same work function which is smaller than the work function of the second gate electrode;
a source region on one side of the gate electrode;
a channel region on the source region, wherein the channel region has a sidewall and a top surface, the interfacial layer is directly disposed on the sidewall and the top surface of the channel region, and the high-k dielectric layer is a separate material layer directly disposed on the interfacial layer; and
a drain region on another side of the gate electrode, wherein the source region and the drain region comprise different conductive types and the TFET is a vertical tunnel field effect transistor.

2. The TFET of claim 1, wherein the high-k dielectric layer comprises $HfO_2$.

3. The TFET of claim 1, wherein the source region comprises a first conductive type, the channel region comprises a second conductive type, and the drain region comprises the second conductive type.

4. The TFET of claim 3, wherein the source region, the channel region, and the drain region comprise group III-V semiconductor compounds.

5. The TFET of claim 4, wherein the first conductive type is p-type and the second conductive type is n-type.

6. A tunnel field effect transistor (TFET), comprising:
an interfacial layer on a substrate, wherein the interfacial layer comprises LaON;
a high-k dielectric layer on the interfacial layer;
a gate electrode on the high-k dielectric layer, wherein the gate electrode comprises a first gate electrode, a second gate electrode and a third gate electrode, the second gate electrode is disposed between the first gate electrode and the third gate electrode, wherein the first gate electrode and the third gate electrode comprise a plurality of raised inverted L-shaped corners, respectively;
a source region on one side of the gate electrode;
a channel region on the source region, wherein the channel region has a sidewall and a top surface, the interfacial layer is directly disposed on the sidewall and the top surface of the channel region, and the high-k dielectric layer is a separate material layer directly disposed on the interfacial layer; and
a drain region on another side of the gate electrode, wherein the source region and the drain region comprise different conductive types and the TFET is a vertical tunnel field effect transistor.

* * * * *